(12) United States Patent
Hill (10) Patent No.: US 6,289,295 B1
(45) Date of Patent: Sep. 11, 2001

(54) SCANNABLE CIRCUITS, SYSTEMS, AND METHODS IMPLEMENTING TRANSISTORS HAVING DIFFERING THRESHOLD VOLTAGES

(75) Inventor: Anthony M. Hill, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/116,704

(22) Filed: Jul. 16, 1998

Related U.S. Application Data (60) Provisional application No. 60/053,187, filed on Jul. 21, 1997.

(51) Int. Cl.[7] ............................................. G01R 31/28
(52) U.S. Cl. ................................. 703/1; 703/4; 714/726; 714/727; 714/728
(58) Field of Search .......................... 703/1, 14; 716/4; 714/30, 733, 726, 727, 728; 327/145

(56) References Cited

U.S. PATENT DOCUMENTS

| | | | |
|---|---|---|---|
| 4,979,190 | * 12/1990 | Sager et al. ........................ | 375/106 |
| 5,592,493 | * 1/1997 | Crouch et al. ..................... | 371/22.3 |
| 5,592,494 | * 1/1997 | Noyuzama ......................... | 371/22.5 |
| 5,673,277 | * 9/1997 | Amitai et al. ...................... | 371/22.3 |
| 5,719,878 | * 2/1998 | Yu et al. ............................ | 371/22.3 |
| 5,812,561 | * 9/1998 | Giles et al. ........................ | 371/22.31 |
| 5,923,601 | * 7/1999 | Wendell ............................. | 365/201 |
| 6,070,259 | * 5/2000 | Roisen et al. ..................... | 714/726 |
| 6,101,623 | * 8/2000 | Noyuzama ........................ | 714/733 |
| 6,106,568 | * 8/2000 | Beausang et al. ................. | 716/18 |
| 6,163,864 | * 12/2000 | Bhavsar et al. ................... | 714/727 |

OTHER PUBLICATIONS

"Hybrid Dual–Threshold Design Techniques for High–Performance Processors with Low–Power Features", Uming Koe, et al., Texas Instruments Incorporated, P. O. Box 660199, M/S 8652, Dallas, Texas 75266–0199, p. 307–311, 1997.

* cited by examiner

Primary Examiner—Kevin J. Teska
Assistant Examiner—Thai Phan
(74) Attorney, Agent, or Firm—Robert D. Marshall, Jr.; W. James Brady, III; Frederick J. Teleky, Jr.

(57) ABSTRACT

An integrated circuit device (10) comprising a conductor (11) for receiving a scan data signal. The integrated circuit device further comprises a plurality of storage circuit devices (SC1 through SC4), and each of those storage circuits has a data input and a data output. A first (SC1) of the plurality of storage circuit devices is coupled to receive the scan data signal at its data input. Moreover, each of the plurality of storage circuit devices other than the first of the plurality of storage circuit devices is coupled to receive at its data input a scan data bit as output from another one of the plurality of storage circuit devices as part of the scan data signal, thereby forming a clocked scan path through the integrated circuit device. The integrated circuit device further comprises a scannable multiplexer circuit (14) having an output (24) coupled to a data input of one (e.g., SC1) of the plurality of storage circuits. The scannable multiplexer circuit comprises a first input ($D_{S1}$) for receiving a scan data bit from the scan data signal and a second input ($D_{N1}$) for receiving a normal operations data bit. The scannable multiplexer circuit further comprises a first transistor device ($22_N$) having its source/drain conductive path coupled between the first input and the output of the scannable multiplexer circuit, and having a first threshold voltage, and also a second transistor device ($20_N$) having its source/drain conductive path coupled between the second input and the output of the scannable multiplexer circuit, and having a second threshold voltage. The first threshold voltage is larger in absolute value than the second threshold voltage.

23 Claims, 3 Drawing Sheets

SCANNABLE CIRCUITS, SYSTEMS, AND METHODS IMPLEMENTING TRANSISTORS HAVING DIFFERING THRESHOLD VOLTAGES

This application claims priority under 35 USC §119 (e)(1) of provisional application Ser. No. 60/053,187 filed July 21, 1997.

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to transistor circuit configurations, and are more particularly directed to scannable circuits, systems, and methods implementing transistors having differing threshold voltages.

In many modem circuit designs, it is desirable to increase the speed of operation of the circuit application. This is commonly true in circuits such as a microprocessor, an application specific integrated circuit ("ASIC"), and a digital signal processor ("DSP"). In such types of circuits, during design the circuits which make up speed-limiting portions or affect the speed of the circuit are constantly scrutinized and re-designed to increase the overall circuit speed. Increased speed increases performance and, therefore, permits more detailed and sophisticated processing capabilities in a shorter amount of time.

Another consideration in the design of modem circuit applications involves testing circuit devices once they are constructed. Typically, such testing is a one time occurrence at the beginning of the life cycle of the device, and provided the device successfully meets the testing criteria, it is then shipped for eventual use in some application. In the context of scannable circuits, this testing is achieved by including within the device some type of scan data path which may be selected as an alternative to the true data path for the device. For example, a multiplexer type input may be used whereby selection of a first path through the multiplexer provides scan data to the circuit device whereas selection of a second path through the multiplexer provides normal operational data to the circuit device. Given this capability, scan data may be input to the device for testing purposes, and then an output or other operational manifestations may be recorded and/or observed to ensure that the circuit device is properly operating.

The present inventor has recognized that the two design considerations set forth above, while important and often critical, also may counteract one another in certain respects. More particularly, while increasing the speed of circuit operation is a key design consideration, the inclusion of additional circuitry necessary to accomplish scannability may limit the speed of circuit operation. Indeed, the scope and design of the scannable circuit may considerably affect the operational speed of the circuit device, depending on its design. As noted earlier, often the circuitry providing the scannability may only be used once at the outset of the life cycle of the device, and certainly is rarely to be expected to be used for more than one percent of the device life cycle. Thus, there is a definite trade off to be considered in providing the scannability function for a small period of time, while not overly restricting the operational circuit of the speed when it is used in its "normal" operation, that is, its regular operation when scanning is not being performed. Thus, below are set forth various embodiments within the present inventive scope which provide for scannable circuit devices while increasing operational speed as compared to prior art devices using scannable circuitry.

BRIEF SUMMARY OF THE INVENTION

In one embodiment, there is an integrated circuit device comprising a conductor for receiving a scan data signal. The integrated circuit device further comprises a plurality of storage circuit devices, and each of those storage circuits has a data input and a data output. A first of the plurality of storage circuit devices is coupled to receive the scan data signal at its data input. Moreover, each of the plurality of storage circuit devices other than the first of the plurality of storage circuit devices is coupled to receive at its data input a scan data bit as output from another one of the plurality of storage circuit devices as part of the scan data signal, thereby forming a clocked scan path through the integrated circuit device. The integrated circuit device further comprises a scannable multiplexer circuit having an output coupled to a data input of one of the plurality of storage circuits. The scannable multiplexer circuit comprises a first input for receiving a scan data bit from the scan data signal and a second input for receiving a normal operations data bit. The scannable multiplexer circuit further comprises a first transistor device leaving its source/drain conductive path coupled between the first input and the output of the scannable multiplexer circuit, and having a first threshold voltage, and also a second transistor device having its source/drain conductive path coupled between the second input and the output of the scannable multiplexer circuit, and having a second threshold voltage. The first threshold voltage is larger in absolute value than the second threshold voltage. Other circuits, systems, and methods are also disclosed and claimed.

DETAILED DESCRIPTION OF THE INVENTION

Figure 1:
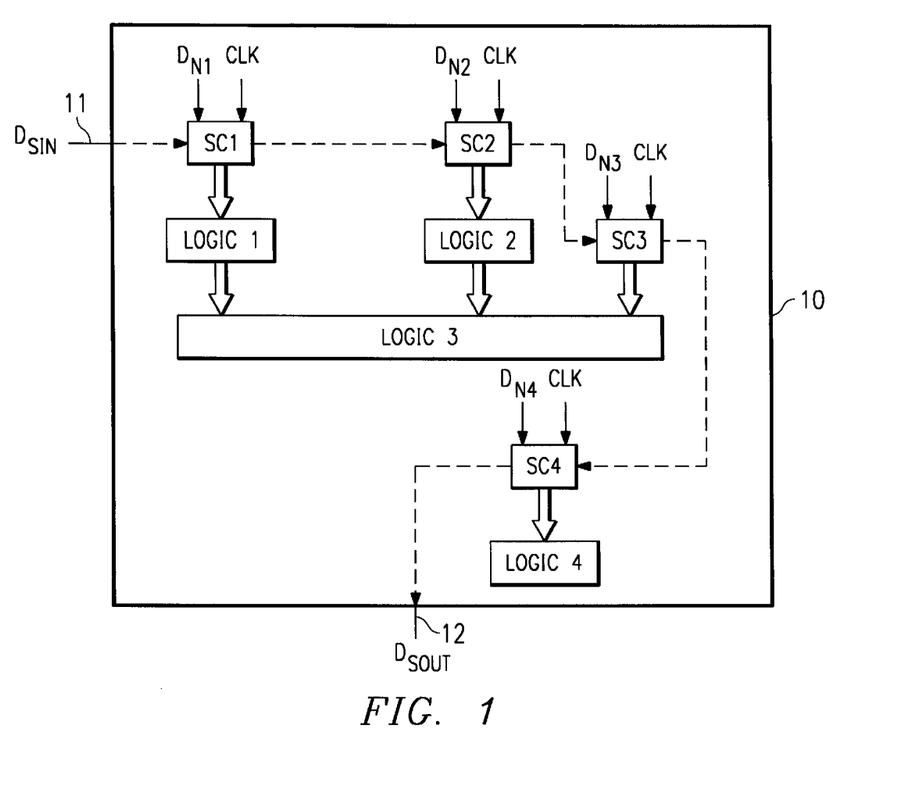
FIG. 1 illustrates an electrical diagram of a integrated circuit product 10 having a scan path.

FIG. 1 illustrates an integrated circuit product designated generally at 10. In the preferred embodiment, integrated circuit product 10 may be one of various types of circuits, such as a microprocessor, an ASIC, or a DSP, or like device where it is desirable to have scannability for testing purposes as detailed later. Note that integrated circuit product 10 may include numerous circuits, connections, and signals which are not shown so as to simplify the present discussion. Instead, integrated circuit product 10 illustrates only sufficient detail to demonstrate the concept of scan testing in contrast to normal operations, where the former is sometimes referred to in the art using various similar names such as scanning or boundary scanning. In any event, scanning as described in the context of FIG. 1 is known in the art, but is provided here as a context to better demonstrate the benefits of the preferred embodiment described below.

In integrated circuit product 10, it includes an input 11 for receiving data for scanning operations and designated $D_{SIN}$. Typically, input 11 is provided by way a pin or other connection which extends external from integrated circuit product 10. Input 11 begins a path which is often referred to as a scan path through the device, and its associated hardware often defines what is referred to as a scan chain Looking to that associated hardware, input 11 is connected to provide a data bit to a first storage circuit SC1 along the scan path. Typically, each storage circuit along the scan chain is some type of flip-flop, latch, or like device. The output of SC1 is connected to the input of a second storage circuit SC2 which, as a storage circuit, is once again some type of flip-flop, latch, or like device. In FIG. 1, this same continuous path continues through two additional storage circuits SC3 and SC4, as well. Note that the use of four storage circuits is merely to illustrate the scanning function, and is not intended as a limitation. In actuality, a scan path may include any number of storage circuits and that number may greatly exceed the relatively small number of four as shown in FIG. 1. Lastly, the scan path ends at an output 12 for outputting data for scanning operations as discussed later, and that output data is designated $D_{SOUT}$.

Each storage circuit of integrated circuit product 10 also includes two additional inputs. A first input to each storage circuit permits a corresponding storage circuit to receive data for normal operations where such data is designated generally at $D_N$. For purposes of establishing a convention, the $D_N$ designator for each of the storage circuits in FIG. 1 further includes in the subscript the number corresponding to the storage circuit For example, storage circuit SC1 is connected to receive normal operations data $D_{N1}$, storage circuit SC2 is connected to receive normal operations data $D_{N2}$, and so forth. A second input to each storage circuit permits the device to be clocked, typically by a clock signal common to all storage circuits, and provided for reasons discussed below. As to this clock input, note further that it is shown only by way of example as a single input. Thus, as known in the art, a scannable circuit actually may include two (or more) clock inputs, and in the instance of two clock inputs one is used to clock data into the storage circuit during scanning operation while the other is used to clock data into the storage circuit during non-scanning operation.

Each storage circuit of integrated circuit product 10 is also connected to provide its single bit output to a block of corresponding logic. As an example, storage circuit SC1 is connected to output its bit to a block identified as LOGIC 1. Note that the logic block is merely a general illustration of some type of functionality which is to be present given the type of device which is provided by integrated circuit product 10. For example, if integrated circuit product 10 is a microprocessor, then the logic could be part of the processing circuitry typical of a central processing unit. In any event, as appreciated below, the scan chain of storage circuits permits testing of the operation of each of the logic blocks.

The operation of the scan chain of integrated circuit product 10 generally performs the functionality introduced in part earlier in the Background Of The Invention, that is, to allow scan data (i.e., $D_{SIN}$) to be input and output for testing, and thereafter to allow normal data (i.e., $D_N$) to be input for non-testing operations. More specifically, this operation is as follows. Typically at the beginning of the circuit life cycle, such as when the device is still at the manufacturer, it is desirable to test integrated circuit product 10. To accomplish this operation, a scan enabling signal (shown later) is asserted high, and then $D_{SIN}$ is serially clocked in via input 11. In other words, a bit of data is presented as $D_{SIN}$, and each storage circuit is simultaneously clocked so that data enters the scan path. As the process continues, each scan data bit shifts along the scan path to the next successive storage circuit. Thus, after several clock cycles, each of storage circuits SC1 trough SC4 stores one of the number of binary values as they were presented as scan data connected to input 11.

Once scan data is stored in the storage circuits in the manner described above, integrated circuit product 10 is tested in various manners. For example, integrated circuit product 10 may be operated for one or more cycles such that the initially input scan data is provided to the various different logic blocks. Thereafter, the resulting operations, states, or outputs are evaluated, and in some instances the scan data may be clocked out of the path and observed via output 12. In any event, it is determined if the operations just performed provide the proper results given that the inputs (to each of the storage circuits) are known and, thus, so are the expected results. This process may be repeated numerous times for different gets of inputs, thereby confirming the operation of various if not all of the attributes of the overall circuit. If the overall circuit is determined to operate in a satisfactory manner, then the semiconductor product 10 is then acceptable to advance in the appropriate marketing channel, such as shipping the device to a retailer for resale to a consumer, direct sale to the consumer, or to another manufacturing group or entity which may include the device in some product or the like. Of course, if the device operation is unsatisfactory, the manufacturer responds in the appropriate manner, such as by merely removing the device from the lot to be shipped or by reconsidering the design of the device or the particular circuit of the device which is determined to be problematic.

Assuming that integrated circuit product 10 is found to operate in a satisfactory manner, for the remainder of its life cycle (assuming later testing is not desired) it is operated with the scanning feature disabled. As an alternative, therefore, each storage circuit then accepts data from its corresponding normal operations input, designated $D_{N1}$ through $D_{N4}$ for storage circuits SC1 through SC4, respectively. In this regard, note that the normal operation data inputs may be presented in various manners, such as from inputs external to integrated circuit product 10 as well as from signals generated within integrated circuit product 10, including signals provided by various ones of the logic blocks. Stated simply, therefore, normal operations of the circuit are then enabled and the scan data path through integrated circuit product 10 provides no operational function for the remainder of the product life cycle.

Figure 2:
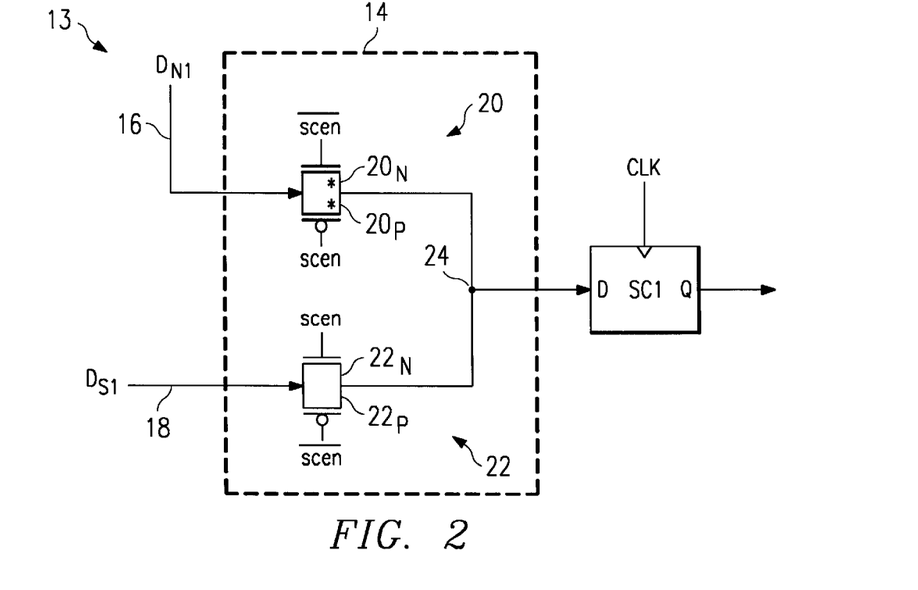
FIG. 2 illustrates a schematic of the circuitry related to a single storage element of the scan path in FIG. 1 and in accordance with the preferred embodiment, where differing threshold voltages are used for different passgate transistors.

Given the introduction of the various stages through the scan path of integrated circuit product 10 shown in FIG. 1, FIG. 2 illustrates a schematic of the circuitry 13 associated with one of the scannable storage circuits in more detail, namely, storage circuit SC1. Note, that storage circuit SC1 is chosen by way of example, and the various concepts and inventive matters discussed below may apply equally as well to the one or more of the remaining scannable storage circuits (i.e., SC2 through SC4 and still others if they were included in integrated circuit product 10). For reasons detailed below, the general construction and operation of circuitry 13 of FIG. 2 is the same as in a prior art configuration including circuitry connected in the manner of FIG. 2; however, the speed of the circuit as well as its leakage current characteristics are quite different based on considerations of transistor threshold voltages. To simplify the discussion, however, the general logic operation which is common to the prior art operation is first described and then followed with a focused discussion of the circuit changes and performance improvements over the prior art Turning first to the construction of circuitry 13 insofar as it is the same as in the prior art, it includes a scannable multiplexer circuit 14 connected to storage circuit SC1. Generally, scannable multiplexer circuit 14 has two inputs 16 and 18 connected to receive the two types of data introduced above. Specifically, input 16 is included to receive the data for normal operations and designated $D_{N1}$, and input 18 is included to receive data for scanning operations and designated $D_{S1}$. Each of inputs 16 and 18 is connected to a passgate 20 and 22, respectively. Passgates 20 and 22 are constructed as known in the art. For example, passgate 20 includes an n-channel transistor $20_N$ and a p-channel transistor $20_P$, where a first source/drain of n-channel transistor $20_N$ is connected to a first source/drain of p-channel transistor $20_P$, and a second source/drain of n-channel transistor $20_N$ is connected to a second source/drain of p-channel transistor $20_P$. Similarly, passgate 22 also includes an n-channel transistor $22_N$ and a p-channel transistor $22_P$ connected in a comparable fashion. Additionally, complementary versions of the scan enable signal, as introduced with respect to FIG. 1, are connected to the gates of the passgate transistors. Thus, the scan enable signal, hereafter abbreviated as scen, is connected to the gate of p-channel transistor $20_P$ while its complement, $\overline{scen}$, is connected to the gate of n-channel transistor $20_N$. Similarly, $\overline{scen}$, is connected to the gate of n-channel transistor $22_N$ while scen is connected to the gate of p-channel transistor $22_P$. The output of passgates 20 and 22 are connected to one another and thereby form an output node 24. Output node 24 therefore provides the output of scannable multiplexer circuit 14 and is connected to the input of storage circuit SC1.

The operation of scannable circuit 10 performs the functionality introduced in connection with FIG. 1, that is, to allow scan data (i.e., $D_{S1}$) to be input to input 18 during testing operations, and thereafter to allow normal operations data (i.e., $D_{N1}$) to be input to input 16. More specifically, this operation is as follows. At the beginning of the circuit life cycle when it is desirable to test integrated circuit product 10, scen is asserted high and scan data, $D_{S1}$, is serially clocked through input 18. Specifically, one skilled in the art will appreciate that asserting scen high enables passgate 22 and disables passgate 20. In other words, the term enable is used in this document to indicate that the gate-to-source voltage of a transistor, which here could be either or both of the transistors forming a passgate, is sufficient such that the transistor conducts. Conversely, the term disable is used in this document to indicate that the gate-to-source voltage of a transistor is such that the transistor does not conduct. Returning to the present example of scannable multiplexer circuit 14, with scen high (and therefore its complement $\overline{scen}$ low) then passgate 22 permits both logic 0's and logic 1's to pass from input 18 to output node 24. Thus, with scen high, successive values for $D_{S1}$ are clocked from input 18 to output 24, and into and out of storage circuit SC1. Recall from above that storage circuit SC1 is operable to shift data to a next successive storage circuit. Thus, after several clock cycles, the chain of storage circuits will store a number of binary values which were presented as scan data as connected to input 18. In any event, once data is stored in storage circuit SC1 in the manner described earlier, integrated circuit product 10 is then tested such as in one of the various manners described above.

Assuming that the overall circuit which includes scannable circuit 13 is found to operate in a satisfactory manner, for the remainder of its life cycle (assuming later testing is not desired) it is operated with scen disabled, that is, with scen de-asserted and therefore set to a low level. Thus, one skilled in the art will appreciate that setting scen low enables passgate 20 and disables passgate 22. Consequently, with scen low (and therefore its complement $\overline{scen}$ high) then passgate 20 permits both logic 0's and logic 1's to pass as normal data, $D_{N1}$, from input 16 to output node 24. At the same time, passgate 22 no longer permits scan data, $D_{S1}$, to reach output node 24. Stated simply, therefore, normal operations of the circuit are then enabled and the data path through passgate 22 provides no operational function for the remainder of the product life cycle.

Given the above operation, the present inventor has recognized certain attributes of the scan path provided by passgate 22, where those attributes are improved upon under the present inventive scope. More particularly, as observed above, the scan path is typically only used at the beginning of the product life cycle and, thus, may be used for time which represents less than one percent of the overall operation of the device. Although this testing may be beneficial, it is therefore desirable to ensure that the scan path provides minimal burden to the overall circuit once "normal" operations (i.e., those which do not involve scan testing) are thereafter implemented. In this regard, FIG. 3 once again illustrates scannable multiplexer circuit 14, but more specifically illustrates a common instance of normal operation where the scan path, although not then serving any operational function, does indeed burden the operation of the overall circuit as detailed below.

Figure 3:
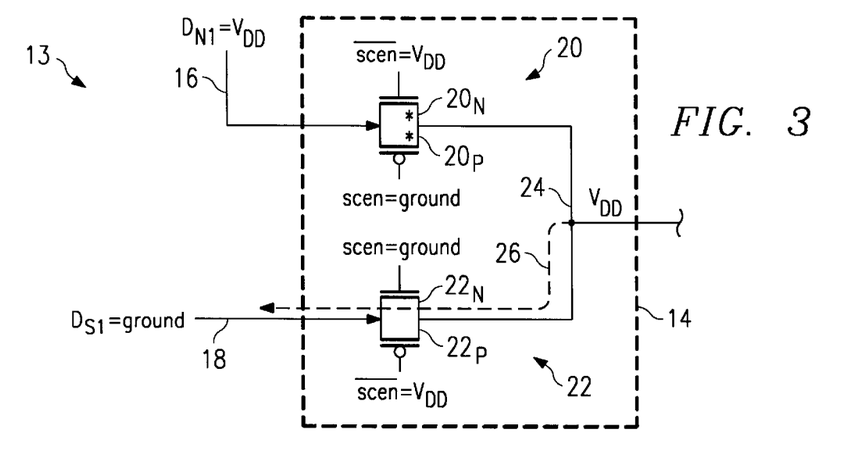
FIG. 3 illustrates the biasing of the circuitry of FIG. 2 such that a leakage path is formed from an output node to the scan data input.

Turning specifically to the example of FIG. 3, first note that since normal operations are presumed, then scen is set to ground which, as detailed earlier, causes scannable multiplexer circuit 14 to select normal data, $D_{N1}$, for passage from input 16 to output node 24. Note, however, that once this occurs, for some cycles of operation the value of $D_{N1}$ will be high, that is, equal to $V_{DD}$ as shown in FIG. 3. Thus, the value of $V_{DD}$ (or approximately that value) reaches output node 24, which therefore is also shown at $V_{DD}$ in FIG. 3. Lastly, because scanning is disabled, it is likely that input 18 is tied to ground, again as shown in FIG. 3.

Given the various potentials in FIG. 3, note now the burdening effect they provide. In particular, note that there is an unequal voltage between output node 24 and input 18. In the present example, this voltage is $V_{DD}$ (or approximately $V_{DD}$). Consequently, there is likely a tendency of current to leak from output node 24 to input 18.

This current leakage path is shown by way of an arrow in phantom in FIG. 3, which is further identified at 26. Given the existence of current leakage path 26 as well as other potential leakage paths in the overall circuit which includes scannable circuit 13, a common approach in the prior art is to determine what total amount of current leakage for the device is an acceptable limit, and then to set the threshold voltage ("$V_T$") of all transistors in the overall circuit to a single $V_T$ to ensure that current leakage does not exceed the determined limit. Thus, in the example of FIG. 3, the transistors in scannable multiplexer circuit 14 would each have the same $V_T$, and it would necessarily provide an acceptable current limit through leakage path 26. While His approach has therefore been considered acceptable in the past, the present inventor has recognized that it provides limitations to the normal operation of the overall circuit. Therefore, by returning to FIG. 2 as done below, the preferred embodiment is now explored given an understanding of the operational and leakage concerns as presented thus far.

Returning now to FIG. 2, and focusing on a key difference between it and the prior art, note that asterisks are shown by p-channel transistor $20_P$ and n-channel transistor $20_N$ of passage 20. Conversely, asterisks are not shown by p-channel transistor $22_P$ and n-channel transistor $22_N$ of passage 22. In the preferred embodiment, these asterisks are used to designate the relative difference between the threshold voltages of these transistors. In other words, the $V_T$ of a transistor with an asterisk (e.g., n-channel transistor $20_N$) is lower than that of a transistor of the same conductivity type and without an asterisk (e.g., n-channel transistor $22_N$).

Before detailing the significance of the use of a low threshold voltage transistor versus a high threshold voltage transistor, note that these terms are used to designate the relative values of one transistor's $V_T$ versus another transistor's $V_T$ and are not necessarily limiting those terms to certain absolute values. Particularly, it is known in the art that a transistor's $V_T$ may be determined by measuring its current-voltage characteristics to determine a gate-to-source voltage where the transistor conducts a small amount of current. To demonstrate the relative nature of threshold voltages, consider the following. For a first transistor with a first $V_T$, it will provide a first amount of drive current at a given drain-to-source voltage (with its gate connected to its drain). For a second transistor with a second $V_T$ lower (in absolute magnitude) than that of the first transistor, the second transistor will provide a second amount of drive current at the given drain-to-source voltage (with its gate connected to its drain), and which drive current is larger than the first amount of drive current provided by the first transistor at that same drain-to-source voltage. For the remainder of this document, a transistor of the first type will be referred to as an HVT transistor (i.e., a transistor with a relatively high $V_T$) while a transistor of the second type will be referred to as an LVT transistor (i.e., a transistor with a relatively low $V_T$). Further, note that an HVT transistor preferably has a $V_T$ on the order of that for transistors which are now used throughout a circuit where all transistors share the same $V_T$, and where that $V_T$ was determined to be high enough to avoid unacceptably large leakage currents. Note also that although an LVT transistor provides the benefit of a higher drive current as opposed to an HVT transistor, in contrast it gives rise to the detriment that it provides a greater leakage current than an HVT transistor. Indeed, the typical leaking by an LVT transistor may be greater than that of an HVT transistor by two or three orders of magnitude or more.

Returning now to FIG. 2, recall from the asterisks that n-channel transistor $20_N$ and p-channel transistor $20_P$ are LVT transistors while n-channel transistor $22_N$ and p-channel transistor $22_P$ are HVT transistors. This distinction is in stark contrast to the prior art, where each of the transistors of a configuration such as in FIG. 2 were constructed to have, and by definition must have had, the same high $V_T$ (i.e., to avoid the unacceptably large leakage current which would exist if a lower $V_T$ were used).

Before proceeding with the benefits of the above-stated distinction where the present embodiments use both HVT and LVT transistors, note then that the embodiments described in this document may be constructed in various manners in order to accomplish different transistors having differing threshold voltages. As a first example, one manner of accomplishing this goal could be using a manufacturing process which specifically permits the creation of circuits using transistors having differing threshold voltages. For example, in current technology, typically a single semiconductor area (e.g. a wafer) is masked and the exposed areas are exposed to an implant which establishes the threshold voltage for the exposed transistor channels of a first conductivity type. For example, the $V_T$ of all n-channel transistors may be set by using tis process, and then repeating it with a different mask set for all p-channel transistors. Thus, using two implant steps, the $V_T$ is set for both n-channel and p-channel transistors. Additionally, for both conductivity types, the depth and/or concentration of the implant used in this manner affects the level of the threshold voltage resulting from the exposure. Under current standards, a common transistor may have a $V_T$ on the order of 500 millivolts. The methodology, however, may be expanded to provide at least two different sets of transistors, where both sets have the same conductivity type but one set includes HVT transistors while the other includes LVT transistors. Using this expanded methodology, and for one conductivity type, a first set of masks could be used to create a set of HVT transistors in the appropriate locations while a second set of masks could be used to create a set of LVT transistors in differing locations. Thus, for a given transistor conductivity types, one implant would take place using the first set of masks to create the HVT transistors. Thereafter, another implant would take place using the second set of masks to create the LVT transistors. Additionally, for a second transistor conductivity type, two more sets of masks and implants would be employed in a like manner. Moreover, to contrast with the 500 millivolt $V_T$ of the HVT transistors, current transistor technology may expect a $V_T$ on the order of 200 millivolts for an LVT transistor. Moreover, these values may vary according to various considerations known in the art. In addition to the above, note further that the formation and/or construction of an HVT transistor versus an LVT transistor may be ascertainable by a person skilled in that art and the particular technique chosen need not be detailed herein. For example, there are currently manufacturing techniques used in static circuits where certain transistors may be LVT transistors while other transistors may be HVT transistors. In this prior art technique, however, the technique is used so that an entire area, such as a set of circuits on an entire circuit die, are constructed using LVT transistors to increase the speed of that set of circuits, but with the recognition that the area constructed in this fashion will have an increased amount of current leakage as compared to the remaining areas on the circuit die which are constructed using HVT transistors. Thus, by modifying this technique or using other techniques available to a person skilled in the art, for purposes of the present embodiments it need be possible that a given circuit may be constructed by intentionally specifying differing threshold voltages for different transistors with the choice of either LVT or HVT transistors within a circuit configuration guided by the embodiments set forth in this document.

Having introduced the concept of mixed HVT and LVT transistor circuitry, it now will be appreciated that the inventor of the present embodiments has recognized the principles set forth above, and created various unique embodiments which benefit from certain attributes of dynamic logic circuits and benefits of both HVT and LVT transistors. The first example of these benefits may be realized by again reviewing the detailed operation of scannable multiplexer circuit 14, but now by focusing particularly on additional operational attributes arising from the use of the differing threshold voltage transistors. Such a discussion follows immediately below.

Recall that the overwhelming majority of time, scannable circuit 13 is operated under normal operations, meaning scen is disabled and data $D_{N1}$ is input to the circuit. In this regard, note now the effect of the mixed HVT and LVT devices with respect to current leakage path 26 of FIG. 3. More specifically, when $D_{N1}$, is high (i.e., $V_{DD}$), there is a possibility of current leakage across path 26. However, because n-channel transistor $22_N$ and p-channel transistor $22_P$ are HVT transistors, the relative high $V_T$ of these devices limits the amount of leakage along path 26 to a desirable low level. When this was accomplished under the prior art, however, note that the same HVT limitation was imposed on the transistors of passgate 20. The present inventor therefore recognized that during normal operation of the prior art device, when data was flowing through passgate 20, the HVT characteristic of passgate 20 would slow the speed of the circuit in that an HVT device takes more time to pass a charge than an LVT device. In general, this may be approximated as considering a conducting transistor as a resistive device, and an HVT transistor provides more resistance (i.e., slower response time) than the lower resistance of an LVT transistor. In stark contrast, however, under the preferred embodiment note now that the data path during normal operations is through LVT devices (i.e., n-channel transistor $20_N$ and p-channel transistor $20_P$), whereas in the prior art it was through HVT devices. Therefore, the speed of data transfer during normal operations of the preferred embodiment (i.e., during submission of $D_{N1}$ via input 16) is faster than that of the prior art. Importantly, therefore, during the majority of the life cycle of the product, that is during the time in which it is operated using $D_N$, the additional existence of the scan path does not also impose the same burden on data throughput as it did in the prior art.

Given the above configuration, one skilled in the art will readily appreciate that the mixing of transistors with differing threshold voltages provides various benefits. During scanning operation, the HVT transistors of passgate 22 are effectively comparable to those in the current art. Thus, while the higher $V_T$ of these devices may slow the operation, it is nevertheless comparable to the prior art. Moreover, speed of operation is less important during mere scan operations, and note again that the scanning operation is only a small period in the life cycle of the product and, therefore, this slower operation is limited only to the short period. On the other hand, during normal operations, note the combined improvements of operation. First, the HVT characteristic of passgate 22 operates to successfully limit current leakage; indeed, this leakage should approximate, or be the same as, the leakage of circuits which included only HVT transistors. Second, and importantly, the LVT characteristic of passgate 20 increases the speed of normal data throughput.

Figure 4:
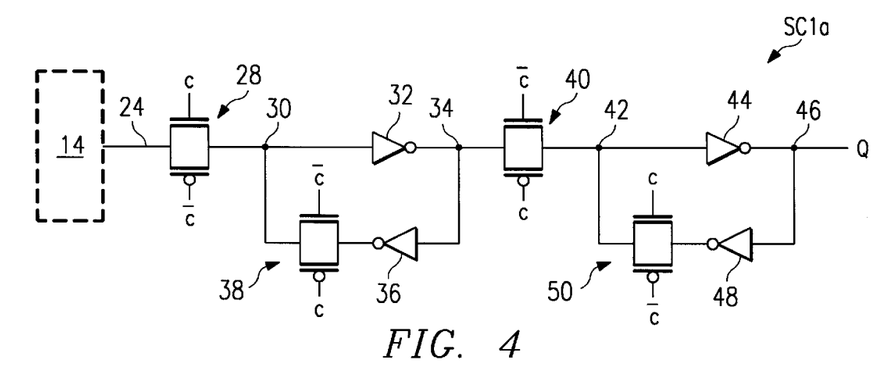
FIG. 4 illustrates a schematic of the scannable multiplexer circuit 14 of FIG. 3 as connected to a D flip-flop storage circuit.

FIG. 4 illustrates scannable circuit 13 of FIG. 2 where storage circuit SC1 is constructed as a D flip-flop which is designated generally at SC1a. More specifically, node 24 is connected to the input of a passgate 28, having an n-channel transistor $28_N$ connected with a p-channel transistor $28_P$, where those transistors have their gates connected to complementary clock signals abbreviated C and $\overline{C}$, respectively. The output of passgate 28 is connected to a node 30, which is further connected to the input of an inverter 32. The output of inverter 32 is connected to a node 34, and node 34 is connected to the input of an inverter 36 which has its output connected to the input of a passgate 38. Passgate 38 has an n-channel transistor $38_N$ connected with a p-channel transistor $38_P$, where those transistors have their gates connected to complementary clock signals $\overline{C}$ and C, respectively. The output of passgate 38 is connected to node 30.

Node 34 is further connected to the input of a passgate 40, having an n-channel transistor $40_N$ connected with a p-channel transistor $40_P$, where those transistors have their gates connected to complementary clock signals $\overline{C}$ and C, respectively. The output of passgate 40 is connected to a node 42, which is further connected to the input of an inverter 44. The output of inverter 44 is connected to a node 46 which represents the output, Q, of D flip-flop SC1a, and which may be connected to functional circuitry or to the input of another D flip-flop, in either case for performing the types of operations described earlier in connection with FIG. 1. In addition, node 46 is connected to the input of an inverter 48 which has its output connected to the input of a passgate 50. Passgate 50 has an n-channel transistor $50_N$ connected with a p-channel transistor $50_P$, where those transistors have their gates connected to complementary clock signals C and $\overline{C}$, respectively. The output of passgate 50 is connected to node 42.

Figure 5:
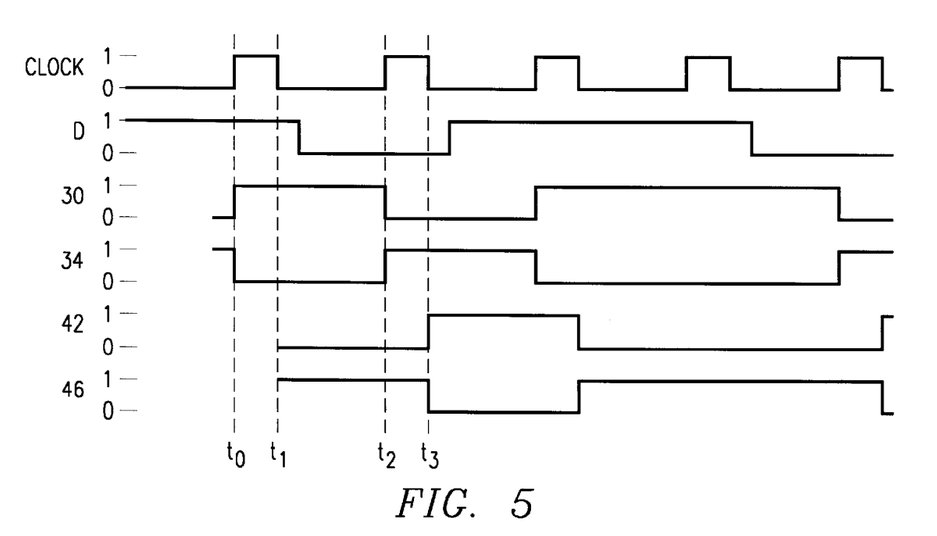
FIG. 5 illustrates a timing diagram of the D flip-flop of FIG. 4.

The operation of D-flip flop SC1a of FIG. 4 is illustrated by the timing diagram of FIG. 5. Turning then to FIG. 5, the top signal shown is a clock signal C as shown connected to various passgates in FIG. 4. Progressing downward in FIG. 5, note that the second signal is the data input to flip-flop SC1a, and note that the operation as illustrated may apply to either scan data, $D_S$, during scan operations (i.e., scen enabled) or to normal data, $D_N$, during normal operations (i.e., scen disabled). Thus, the second waveform of FIG. 5 is merely labeled D to suggest either type of data and represents an arbitrary binary sequence by way of example. The remaining four waveforms of FIG. 5 illustrate the signals at nodes 30, 34, 42, and 46, respectively. Lastly, before proceeding, note for purposes of simplification that various delays are not shown in FIG. 5 when in actuality the transitions shown are not instantaneous.

Turning to FIG. 5 to demonstrate the operation of D flip-flop SC1a, at t0 the clock signal transitions high, and at that time the data is high. The high value of the clock enables passgate 28 and, therefore, the high data value passes to node 30. Shortly after t0, although the delay is not shown in FIG. 5, this high value at node 30 is inverted by inverter 32 to provide a low value to node 34. Note also at this time that both passgate 38 and passgate 40 are disabled. Next, at t1, the clock signal transitions low. The low value of the clock signal enables both passgate 38 and passgate 40. With respect to the passgate 38, it passes the high signal output by inverter 36 to node 30, thereby maintaining node 30 high. With respect to passgate 40, it passes the low from node 34 to node 42. Moreover, this low is inverted by inverter 44, thereby providing a high at node 46 (i.e., the Q output). Thus, the state of each nodes 30, 34, 42, and 46 remains as just described until t2, when the clock signal again transitions.

At t2, the clock signal transitions high, and at that time the data is low. The high value of the clock enables passgate 28 and, therefore, the low data value passes to node 30. Shortly after t2, this low value at node 30 is inverted by inverter 32 to provide a high value to node 34. Next, at t3, the clock signal transition low. The low value of the clock signal enables both passgate 38 and passgate 40, and the former passes the low signal output by inverter 36 to node 30, while the latter passes the high from node 34 to node 42. Moreover, this high is inverted by inverter 44, thereby providing a low at Q output node 46. Once again, therefore, the state of each nodes 30, 34, 42, and 46 remains as just described until t4, when the clock signal again transitions.

Given the above, one skilled in the art may trace the remaining signals of FIG. 5 without having to detail each of those in the present discussion. In any event, such a person should now appreciate that D flip-flop SC1a of FIG. 4 operates to output at the falling edge of a clock cycle the data as it was input during the rising edge of that clock cycle. Moreover, when combined with scannable multiplexer circuit 14 in the manner shown and as described earlier, note therefore that the data throughput to D flip-flop SC1a may be increased when the data D represents data of normal operations. Thus, overall device speed is improved during such operations.

Figure 6:
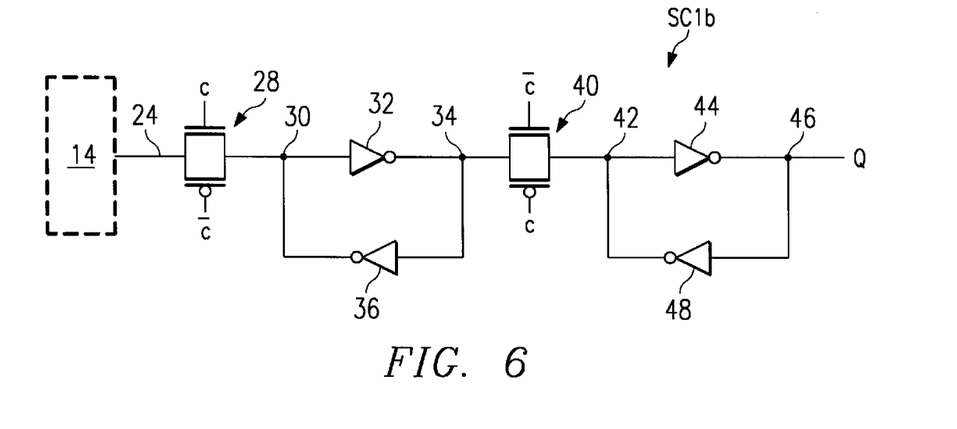
FIG. 6 illustrates a schematic of the scannable multiplexer circuit 14 of FIG. 3 as connected to a low area D flip-flop storage circuit.

FIG. 6 illustrates scannable circuit 13 of FIG. 2 where storage circuit SC1 is constructed as a low area D flip-flop designated generally at SC1b. More specifically, by comparing FIGS. 4 and 6, one skilled in the art will appreciate that D flip-flop SC1b is schematically the same as D flip-flop SC1a, with the exception that two passgates of D flip-flop SC1a are eliminated to form D flip-flop SC1b. In this regard, to compare the two structures, the same reference numerals from the schematic elements of FIG. 4 are carried forward to FIG. 6. Thus, by comparing FIGS. 4 and 6, note that the latter excludes passgates 38 and 50. Consequently, there is a reduced amount of device area required to construct D flip-flop SC1b.

Given the like construction of D flip-flops SC1a and SC1b, as well as the timing illustrations of FIG. 5, note further that the general operation is the same, that is, D flip-flop SC1b operates to output at the falling edge of a clock cycle the data as it was input during the rising edge of that clock cycle. The notable difference of D flip-flop SC1b, however, is that the relative sizes of the transistors in passgate 38 may need to be increased over those in inverter 36, and the relative sizes of the transistors in passgate 40 may need to be increased over those in inverter 48, both of which will ensure proper state changes when the corresponding passgate is enabled. In any event, once again this structure, as combined with scannable multiplexer circuit 14, provides improved data throughout as compared to the prior art.

Figure 7:
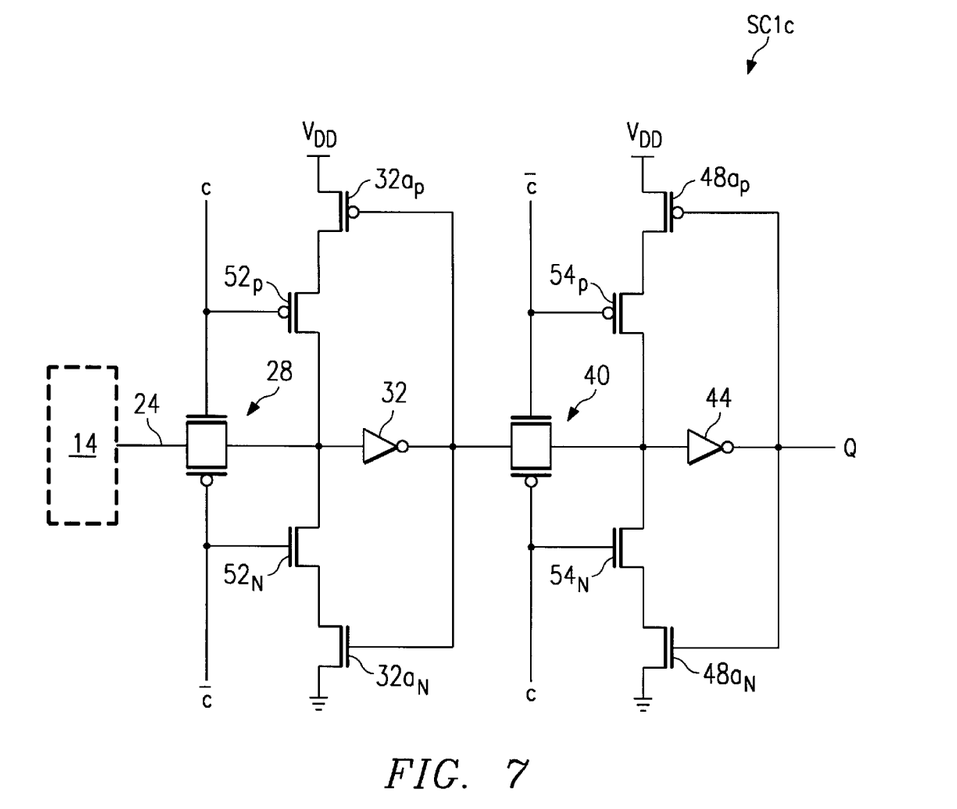
FIG. 7 illustrates a schematic of the scannable multiplexer circuit 14 of FIG. 3 as connected to a low power D flip-flop storage circuit.

FIG. 7 illustrates scannable circuit 13 of FIG. 2 where storage circuit SC1 is constructed as a low power D flip-flop designated generally at SC1c. Now, by comparing FIGS. 5 and 7, one skilled in the art will once appreciate various common aspects between the two D flip-flops, and again to facilitate such a comparison like reference numerals from the schematic elements of FIG. 5 are carried forward to FIG. 7. At the outset, both scannable circuits include scannable multiplexer circuit 14 having an output node 24 connected to the input of a D flip-flop. Looking to D flip-flop SC1c, it like D flip-flop SC1a includes passgates 28 and 40, and inverters 32 and 44. Moreover, it is known in the art that an inverter may be formed by connecting the gates of a p-channel transistor and an n-channel transistor to form the inverter input, by connecting the source of the p-channel transistor to $V_{DD}$ and the source of the n-channel transistor connected to ground, and by connecting the drains of the transistors to form the inverter output. Given this background, note that it somewhat is applied in FIG. 7 in that inverter 32 from FIG. 6 is replaced in FIG. 7 using a p-channel transistor $32a_P$ having its source connected to $V_{DD}$, and an n-channel transistor $32a_N$ having its source connected to ground, where the gates of these transistors are connected to one another, but the drains of these two transistors are not directly connected to one another. Instead, the drain of p-channel transistor $32a_P$ is connected to the source of a p-channel transistor $52_P$, which has its gate connected to the C signal (i.e., clock signal) and its drain connected to node 30. Moreover, the drain of n-channel transistor $32a_N$ is connected to the source of an n-channel transistor $52_N$, which has its gate connected to the $\overline{C}$ signal (i.e., the complement of the clock signal) and its drain connected to node 30. Note further that a similar configuration is used in D flip-flop SC1c with respect to what is inverter 48 of D flip-flop SC1b in FIG. 6. Thus, inverter 48 from FIG. 6 is replaced in FIG. 7 using a p-channel transistor $48a_P$ having its source connected to $V_{DD}$, and an n-channel transistor $48a_N$ having its source connected to ground, where the gates of these transistors are connected to one another. Further, the drain of p-channel transistor $48a_P$ is connected to the source of a p-channel transistor $54_P$, which has its gate connected to the $\overline{C}$ signal and its drain connected to node 42. Moreover, the drain of n-channel transistor $48a_N$ is connected to the source of an n-channel transistor $54_N$, which has its gate connected to the C signal and its drain connected to node 42.

Once more given the comparable construction of D flip-flops SC1a and SC1c, as well as the timing illustrations of FIG. 5, note further that the general operation is the same, that is, D flip-flop SC1c operates to output at the falling edge of a clock cycle the data as it was input during the rising edge of that clock cycle. The notable difference of D flip-flop SC1c, however, is that for D flip-flop SC1a, a feedback signal such as that from node 34 passes first to control an inverter which has its output pass through a passgate, whereas for D flip-flop SC1c, the same feedback signal is separated to two different paths, and each of those paths first controls the conduction of a transistor which is connected in series to another transistor of the same conductivity type. For example, from node 34, note that a first feedback path is created to control the gate of p-channel transistor $32a_P$, and the conductive state of that transistor in turn provides a bias to p-channel transistor $52_P$ which permits it thereafter to be enabled by a low transition of the clock signal. Similarly, also from node 34, a second feedback path is created to control the gate of n-channel transistor $32a_N$, and the conductive state of that transistor in turn provides a bias to n-channel transistor $52_N$ which permits it thereafter to be enabled by a high transition of the clock signal. Similar characteristics will be appreciated by one skilled in the art with respect to the relationship of p-channel transistors $48a_P$ and $54_P$, as well as n-channel transistors $48a_N$ and $54_N$. Once more, therefore, the combination structure of FIG. 7 realizes improved data throughput as compared to the prior art.

From the above, it may be appreciated that the above embodiments are readily implemented in a wide range of integrated circuit products, where scan testing is desired in such devices. Moreover, when implemented, circuits constructed and operated according to the present inventive embodiments may approximate or match current leakage limitations of the prior art during normal operations, while also improving device speed during such operations. Moreover, while the present embodiments have been described in detail, various substitutions, modifications or alterations could be made to the descriptions set forth above without departing from the inventive scope. Indeed, various examples of changes have been set forth above, and still others will be ascertainable by one skilled in the art. In this regard, various flip-flops are shown above as embodiments which benefit from the present inventive teachings, but it should be understood that still other flip-flop devices, as well as other types of scannable storage circuits, may likewise implement the combined threshold voltage transistor technology described above. As yet another example, while the flip-flops described above are falling edge triggered devices, the present inventive scope contemplates rising edge triggered devices as well. Thus, these examples as well as the other benefits set forth above merely demonstrate particular instances of the inventive scope, where that scope is defined by the following claims.

What is claimed is:

1. An integrated circuit device, comprising:
   a conductor for receiving a scan data signal;
   a plurality of storage circuit devices each having a data input and a data output;
   wherein a first of the plurality of storage circuit devices is coupled to receive the scan data signal at its data input;
   wherein each of the plurality of storage circuit devices other than the first of the plurality of storage circuit devices is coupled to receive at its data input a scan data bit as output from another one of the plurality of storage circuit devices as part of the scan data signal, thereby forming a clocked scan path through the integrated circuit device;
   and further comprising scannable multiplexer circuit having an output coupled to a data input of one of the plurality of storage circuits, wherein the scannable multiplexer circuit comprises:
      a first input for receiving a scan data bit from the scan data signal;
      a second input for receiving a normal operations data bit;
      a first transistor device having its source/drain conductive path coupled between the first input and the output of the scannable multiplexer circuit, and having a first threshold voltage;
      a second transistor device having its source/drain conductive path coupled between the second input and the output of the scannable multiplexer circuit, and having a second threshold voltage; and
      wherein the first threshold voltage is larger in absolute value than the second threshold voltage.

2. The integrated circuit device of claim 1:
   wherein the scannable multiplexer circuit is a first scannable multiplexer circuit;
   wherein the plurality of storage circuits consist of an integer number N of storage circuits;
   and further comprising the integer number N of scannable multiplexer circuits which includes the first scannable multiplexer circuit, wherein each of the scannable multiplexer circuits has an output coupled to a data input of a corresponding one of the plurality of storage circuits, and comprises:
      a first input for receiving a scan data bit from the scan data signal;
      a second input for receiving a normal operations data bit;
      a first transistor device having its source/drain conductive path coupled between the first input and the output of the scannable multiplexer circuit, and having a first threshold voltage;
      a second transistor device having its source/drain conductive path coupled between the second input and the output of the scannable multiplexer circuit, and having a second threshold voltage; and
      wherein the first threshold voltage is larger in absolute value than the second threshold voltage.

3. The integrated circuit device of claim 2:
   wherein the first transistor device of each of the integer number N of scannable multiplexer circuits comprises a first conductivity type;
   wherein the second transistor device of each of the integer number N of scannable multiplexer circuits comprises the first conductivity type;
   and wherein each of the integer number N of scannable multiplexer circuits further comprises:
      a third transistor device of a second conductivity type different than the first conductivity type and having its source/drain conductive path coupled between the first input and the output of the scannable multiplexer circuit, and having a third threshold voltage;
      a fourth transistor device of the second conductivity type having its source/drain conductive path coupled between the second input and the output of the scannable multiplexer circuit, and having a fourth threshold voltage;
      wherein the third threshold voltage is larger in absolute value than the fourth threshold voltage.

4. The integrated circuit device of claim 1:
   wherein the first transistor device comprises a first conductivity type;
   wherein the second transistor device comprises the first conductivity type;
   and wherein the scannable multiplexer circuit further comprises:
      a third transistor device of a second conductivity type different than the first conductivity type and having its source/drain conductive path coupled between the first input and the output of the scannable multiplexer circuit, and having a third threshold voltage;
      a fourth transistor device of the second conductivity type having its source/drain conductive path coupled between the second input and the output of the scannable multiplexer circuit, and having a fourth threshold voltage; and
      wherein the third threshold voltage is larger in absolute value than the fourth threshold voltage.

5. The integrated circuit device of claim 1 wherein the first transistor device and the second transistor device are n-channel transistors.

6. The integrated circuit device of claim 1 wherein the first transistor device and the second transistor device are p-channel transistors.

7. The integrated circuit device of claim 1 wherein the integrated circuit is a microprocessor.

8. The integrated circuit device of claim 1 wherein the integrated circuit is an application specific integrated circuit.

9. The integrated circuit device of claim 1 wherein the integrated circuit is a digital signal processor.

10. The integrated circuit device of claim 1 wherein the storage circuit comprises a flip-flop.

11. The integrated circuit device of claim 10 wherein the flip-flop comprises:
    a first passgate having an input connected to the data input;

a first inverter having an input connected to an output of the first passgate;

a second inverter having an input connected to an output of the first inverter;

a second passgate having an input connected to an output of the second inverter and an output connected to the input of the first inverter;

a third passgate having an input connected to the output of the first inverter;

a third inverter having an input connected to an output of the third passgate;

a fourth inverter having an input connected to an output of the third inverter;

a fourth passgate having an input connected to an output of the fourth inverter and an output connected to the input of the third inverter; and wherein the output of the third inverter provides the data output of the flip-flop.

12. The integrated circuit device of claim 10 wherein the flip-flop comprises:

a first passgate having an input connected to the data input;

a first inverter having an input connected to an output of the first passgate;

a second inverter having an input connected to an output of the first inverter and an output connected to the input of the first inverter;

a second passgate having an input connected to the output of the first inverter;

a third inverter having an input connected to an output of the second passgate;

a fourth inverter having an input connected to an output of the third inverter and having an output connected to the input of the third inverter; and wherein the output of the third inverter provides the data output of the flip-flop.

13. The integrated circuit device of claim 10 wherein the flip-flop comprises:

a first passgate having an input connected to the data input;

a first inverter having an input connected to an output of the first passgate;

a first p-channel transistor having a gate connected to the output of the first inverter and a source connected to a first voltage potential;

a first n-channel transistor having a gate connected to the output of the first inverter and a source connected to a second voltage potential less than the first voltage potential;

a second p-channel transistor having a source connected to a drain of the first p-channel transistor, a gate coupled to receive a clock signal, and a drain connected to the input of the first inverter;

a second n-channel transistor having a source connected to a drain of the first n-channel transistor, a gate coupled to receive a complement of the clock signal, and a drain connected to the input of the first inverter;

a second passgate having an input connected to an output of the first inverter;

a second inverter having an input connected to an output of the second passgate;

a third p-channel transistor having a gate connected to the output of the second inverter and a source connected to the first voltage potential;

a third n-channel transistor having a gate connected to the output of the second inverter and a source connected to the second voltage potential;

a fourth p-channel transistor having a source connected to a drain of the third p-channel transistor, a gate coupled to receive the complement of the clock signal, and a drain connected to the input of the second inverter; and a fourth n-channel transistor having a source connected to a drain of the third n-channel transistor, a gate coupled to receive the clock signal, and a drain connected to the input of the second inverter; and wherein the output of the second inverter provides the data output of the flip-flop.

14. The integrated circuit device of claim 1 wherein the storage circuit comprises a latch.

15. The integrated circuit device of claim 1 and further comprising logic circuitry coupled to receive data from the data outputs of the plurality of storage circuits.

16. A method of operating an integrated circuit device, comprising the steps of:

enabling a scan test signal to the integrated circuit device;

serially clocking data along a first conductive path into a first one of a plurality of storage circuit devices located on the integrated circuit device, wherein the first conductive path has a first threshold voltage;

disabling the scan test signal to operate the integrated circuit device under normal operations;

inputting data along a second conductive path to the first one of a plurality of storage circuit devices located on the integrated circuit device, wherein the second conductive path has a second threshold voltage; and wherein the first threshold voltage is larger in absolute value than the second threshold voltage.

17. The method of claim 16:

wherein the first conductive path comprises a source/drain conductive path of a first transistor device; and wherein the second conductive path comprises a source/drain conductive path of a second transistor device.

18. The method of claim 16:

wherein the first conductive path comprises a source/drain conductive path of a first transistor device connected in parallel with a source/drain conductive path of a second transistor device; and wherein the second conductive path comprises a source/drain conductive path of a third transistor device connected in parallel with a source/drain conductive path of a fourth transistor device.

19. The method of claim 18 wherein the first and second transistor devices are of different conductivity type.

20. The method of claim 19 wherein the third and fourth transistor devices are of different conductivity type.

21. The method of claim 16 wherein the integrated circuit is a microprocessor.

22. The method of claim 16 wherein the integrated circuit is an application specific integrated circuit.

23. The method of claim 16 wherein the integrated circuit is a digital signal processor.

* * * * *